(12) United States Patent
Chen et al.

(10) Patent No.: US 7,132,854 B1
(45) Date of Patent: Nov. 7, 2006

(54) DATA PATH CONFIGURABLE FOR MULTIPLE CLOCKING ARRANGEMENTS

(75) Inventors: Suwei Chen, Redmond, WA (US);
Sanjay Sancheti, Sunnyvale, CA (US);
Jeffery Scott Hunt, Ackerman, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 74 days.

(21) Appl. No.: 10/949,537

(22) Filed: Sep. 23, 2004

(51) Int. Cl.
*H03K 19/173* (2006.01)
*H03K 3/289* (2006.01)

(52) U.S. Cl. .......................... 326/46; 326/93; 327/202; 327/407

(58) Field of Classification Search ................ 326/40, 326/46, 93; 327/202, 218, 407
See application file for complete search history.

(56) References Cited

U.S. PATENT DOCUMENTS

| | | | |
|---|---|---|---|
| 5,581,199 A * | 12/1996 | Pierce et al. .................. | 326/41 |
| 6,069,839 A | 5/2000 | Pancholy et al. | |
| 6,262,936 B1 | 7/2001 | Arcoleo et al. | |
| 6,262,937 B1 | 7/2001 | Arcoleo et al. | |
| 6,275,441 B1 | 8/2001 | Oh | |
| 6,282,150 B1 * | 8/2001 | Edo ........................... | 365/233 |
| 6,378,008 B1 | 4/2002 | Gradinariu et al. | |
| 6,385,128 B1 | 5/2002 | Arcoleo et al. | |
| 6,662,315 B1 | 12/2003 | Gradinariu et al. | |
| 6,985,096 B1 * | 1/2006 | Sasaki et al. ................ | 341/100 |

OTHER PUBLICATIONS

U.S. Appl. No. 10/877,932, Parameswaran et al.
U.S. Appl. No. 10/810,038, Manapat et al.

* cited by examiner

*Primary Examiner*—Daniel Chang
(74) *Attorney, Agent, or Firm*—Bradley T. Sako

(57) ABSTRACT

A data path (200) can be configured to accommodate different clocking arrangements. In one mode, data values may be output at a single data rate: one data value every clock cycle. In another mode, data values may be output at a double data rate: two data values every clock cycle. A data path (200) can be compact circuit structure, needing only an additional mode multiplexer (206) and inverter over a conventional D-type master-slave flip-flop.

19 Claims, 7 Drawing Sheets

DATA PATH CONFIGURABLE FOR MULTIPLE CLOCKING ARRANGEMENTS

TECHNICAL FIELD

The present invention relates generally to integrated circuits, and more particularly to configurable data paths for use in integrated circuits.

BACKGROUND OF THE INVENTION

For semiconductor integrated circuits (chips) such as memory devices, it can be cost effective to include multiple product configurations in one base design. For example, it would be desirable for a device to be capable of accommodating multiple output data configurations.

While memory devices typically perform a like function—storing data values for subsequent access, various data input/output configurations have been proposed. As a first example, the rate at which data can be accessed with a respect to a clock signal has given rise to single data rate (SDR) type designs, in which data is accessed once per clock cycle. At the same time, to increase throughput, double data rate (DDR) type designs are known which can access data twice per cycle (e.g., on rising and falling edge of clock cycle).

In order to better understand various aspects of the present invention, conventional output circuits for accommodating different clocking arrangements will now be described.

A first conventional output circuit for accommodating SDR timing is shown in FIG. 8A. FIG. 8A shows a conventional D-type "master-slave" flip-flop DFF 800. DFFs are often used as output registers in data communication product that output data in an SDR mode.

The DFF circuit 800 of FIG. 8A includes a master latch 802, a slave latch 804, and an output multiplexer (MUX) 806. A master latch 802 can include inverters I81 to I83, and passgates T81 and T82. Passgate T81 is enabled in response to an inverse clock signal CB, while passgate T82 is enabled in response to a clock signal C. In a similar fashion, a slave latch 804 can include inverters I84 to I86, and passgates T83 and T84. However, passgates T83 and T84 are enabled in the opposite fashion, with passgate T83 being enabled in response to clock signal C, while passgate T84 is enabled in response to inverse clock signal CB.

Complementary clock signals C and CB can be two de-skewed clock signals, typically generated from a single external clock. For simplicity, only a data path is shown in FIG. 8A.

In FIG. 8A, an output from master latch 802 can be provided to both a first input N81 of output MUX 806, as well as the input of slave latch 804. Slave latch 804 can have an output coupled to a second input N82 of output MUX 806. When inverse clock CB is low, output MUX 806 couples a first input N81 to a MUX output to provide an output value Q. Conversely, when clock signal C at an inverting control input is low, second input N82 can be coupled to the output of MUX 806 to provide the output value Q.

The operation of the circuit of FIG. 8A is shown in FIG. 8B. FIG. 8B is a timing diagram showing waveforms for clock signal C, inverted clock signal CB, an input data value DIN, MUX input node N81 and N82, and an output value Q.

Referring now to FIG. 8B in conjunction with FIG. 8A, prior to time t0, when inverse clock signal CB is high, master latch 802 can be in a "transparent" mode, allowing an input data value D<1> to propagate through to input N81. In addition, slave latch 804 can be in a latched mode, storing a previously received data value and preventing any input value from propagating through. In the example shown, a previous data value D<0> is latched within slave latch 804, and output as data value Q by way of second input N82.

At time t0, when clock signal C transitions high and inverse clock signal CB transitions low, master latch 802 can enter a latched state, latching data value D<1> and providing such a data value to node N81. Because inverse clock signal CB can be low, output MUX 806 can output data value D<1>. As a result, output value Q sees a change from the old bit D<0> to the new bit D<1>. At the same time, slave latch 804 can enter a transparent mode, allowing data value D<1> to propagate through to node N82.

At time t1, clock signal transitions from high to low. As a result, slave latch 804 can go into a latched mode, and continue to output data value D<1>. Because clock signal C goes low, data value D<1> at second input node ND2 can be provided as output value Q.

Operations can continue in this manner to provide a different output value each clock cycle.

In contrast to SDR type operations described above, in a DDR device, such as a DDR memory device, a 2-to-1 parallel-in-serial-out (PISO) type circuit is often used as an output register. A 2-to-1 PISO can convert 2-bit parallel data to 1-bit serial data at double data rate.

One example of a conventional 2-to-1 PISO is shown in FIG. 9A, and designated by the general reference character 900. A 2-to-1 PISO can include two DFFs 902-0 and 902-1 and an output MUX 904. A first DFF 902-0 can receive a first input data value DH and provide an output value on a node N91. Similarly, second DFF 902-1 can receive a second input data value DL and provide an output value on a node N92. First DFF 902-0 operates in response to clock signal C, while second DFF 902 operates in response to inverse clock signal CB.

As understood from the figure, when clock signal C is low, output MUX 904 couples a first input N91 to a MUX the output to provide an output value DOUT. When inverse clock signal CB at an inverting control input is low, second input N92 can be coupled to the output of MUX 904 to provide the output value DOUT.

As in case of the SDR arrangement in FIG. 8A, complementary clock signals C and CB can be two de-skewed clock signals, typically generated from a single external clock. In addition, only a data path is shown in FIG. 9A to avoid cluttering the view.

The operation of the circuit of FIG. 9A is shown in FIG. 9B. FIG. 9B is a timing diagram showing waveforms for clock signal C, inverted clock signal CB, first and second input data values DH and DL, nodes N91 and N92 of output MUX 904, and an output value DOUT.

As understood from FIGS. 9A and 9B, both DFFs (902-0 and 902-1) are edge-triggered registers. When clock signal C switches from low to high and inverse clock signal switches from high to low, output MUX 904 can select a data value at node N91 to pass through and output as DOUT. At the same time, first DFF 902-0 can latch a first input value DH and provide it at node N91. When clock signal C switches from high to low, and inverse clock switches from low to high, output MUX 904 can select node N91 to pass through as output DOUT. Second DFF 902-1 can then latch a second input value DL, and provide it at node N92.

In the arrangement of FIGS. 9A and 9B, it can be critical to have clock signals (e.g., C and CB) routed in the reverse direction with respect to a flow of data through the circuit.

This can ensure that output MUX 904 switches (i.e., outputs) node N91 before node N92 is updated by an incoming data value, and vice versa.

In conventional approaches, providing for SDR and DDR timing for a same type of device is typically accomplished by separate circuits (i.e., a DFF for an SDR mode and a 2-to-1 PISO for DDR mode). While it is possible to reuse an existing DFF from within a 2-to-1 PISO in order to provide a DFF for an SDR mode, such an arrangement typically requires a more complicated multiplexing scheme. Further, in such an arrangement, the components of the 2-to-1 PISO are not used efficiently, thus wasting space on the device.

In light of the above, it would be desirable to arrive at a single circuit that can support both SDR and DDR modes of operation.

It would also be desirable that such a single circuit is selectable between such modes by a simple manufacturing option.

It would also be desirable that such a single circuit be comparable to a DFF in terms of area and speed.

SUMMARY OF THE INVENTION

The present invention can include a configurable data path that includes a first clocked latch having an input that receives a first data value and an output coupled to one input of an output multiplexer (MUX) circuit. In addition, a mode MUX circuit can have one input that receives a second input value and another input coupled to the output of the first clocked latch. A second clocked latch can have an input coupled to an output of the mode MUX circuit, and an output coupled to another input of the output MUX circuit.

Such a circuit can accommodate single data rate (SDR) and double data rate (DDR) modes. However, unlike conventional arrangements, the circuit can be relatively compact.

According to one aspect of the embodiments, an output MUX circuit can select between one input and another input on essentially different half clock cycles of the same clock signal.

According to another aspect of the embodiments, a mode MUX circuit can select between one input and the other input based on a single mode signal.

Such an arrangement can enable easy switching between modes.

According to another aspect of the embodiments, a mode MUX circuit can be formed with logic gates. Alternatively, a mode MUX can be formed with tri-state driver circuits. Still further, a mode MUX circuit can be formed with pass-gate circuits.

According to another aspect of the embodiments, a first clocked latch can include a first input passgate enabled in response to an inverse latch clock signal, a first inverter having an input coupled to the output of the first input passgate, a second inverter having an input coupled to the output of the first inverter, and a first latching passgate enabled in response to a latch clock signal and an output coupled to the input of the first inverter.

According to another aspect of the embodiments, an output MUX can be controlled in response to a clock signal. In addition, the first and second clocked latches can also be controlled in response to the clock signal. In addition, the data path can further include a clock routing circuit that provides control signals for the output MUX type circuit, second clocked latch and first clocked latch. Such clock signals can be routed in a direction opposite to data flow through the data path.

Such an arrangement can help ensure that an output MUX path is closed before a next data value is received.

According to another aspect of the embodiments, an output MUX circuit can select one of the inputs on essentially different half clock cycles of a MUX control signal. In addition, the MUX control signal does not overlap the latch clock signals.

Such an arrangement can provide an alternate way to help ensure that an output MUX path is closed before a next data value is received.

The present invention can also include a data path circuit configurable between at least a single data rate (SDR) and double data rate (DDR) mode. A data path circuit can include a slave latch and master latch. A mode multiplexer (MUX) circuit can be disposed between the master latch and the slave latch, having one input coupled to the output of the master latch, another input that receives a first data value, and an output coupled to the input of the slave latch. An output MUX circuit can have one input coupled to the output of the master latch and another input coupled to the output of the slave latch.

In this way, a data path circuit can accommodate different data rate modes with a circuit that includes only a few additional components over a conventional D-type master-slave flip-flop.

According to another aspect of the embodiments, an output MUX circuit can couple an output of the slave latch to an output node when a clock signal is low, and couple an output of the master latch to the output node when a complementary clock signal is low.

Such an arrangement can allow single or double data rate modes by outputting a same data value from master and slave latches in a single data rate mode, and outputting different data values from master and slave latches in a double data rate mode.

The present invention can also include a semiconductor memory device having an output circuit configurable between at least two clocking modes. The output circuit can include a first register section having an input coupled to a first data output of a memory cell array. The first register section being transparent in response to an inverse clock signal and can latch a data value in response to a clock signal. The output circuit can also include a mode multiplexer (MUX) having a first input coupled to a second data output of a memory cell array, a second input coupled to the output of the first register section, and a control input that receives a mode signal. A second register section can be included that has an input coupled to an output of the mode MUX. The second register section can be transparent in response to the clock signal and latch in response to the inverse clock signal.

In this way, a semiconductor memory device can provide support for DDR and SDR output rates with a relatively compact circuit.

According to one aspect of the embodiments, a semiconductor memory device can also include an output MUX having a first MUX input coupled to an output of the first register section and a second MUX input coupled to an output of the second register section. A MUX output can be coupled to an external data output of the semiconductor memory device According to another aspect of the embodiments, a semiconductor memory device can also include a dual port static random access memory (SRAM) array coupled to the first data output and the second data output.

According to another aspect of the embodiments, a semiconductor memory device can include N external data outputs, and one output circuit corresponding to each external data output.

In this way, the output circuit can be repeated for each data output of a semiconductor memory device.

According to another aspect of the embodiments, a semiconductor memory can further include a mode signal generator circuit that generates the mode signal in response to a bonding option.

In this way, a semiconductor memory device can be placed in a particular mode (e.g., SDR or DDR) with a relatively simple manufacturing option.

According to another aspect of the embodiments, a mode signal generator can generate a mode signal in response to various methods, including a metallization option, a non-volatile memory cell, a fusible link, and an anti-fuse structure.

DETAILED DESCRIPTION

Various embodiments of the present invention will now be described in detail with reference to a number of drawings. The embodiments include a data path circuit that can serve as an output register circuit that has both single data rate (SDR) and double data rate (DDR) capabilities. In the embodiments described, in an SDR mode, a data path circuit can act in the same general fashion as a D-type flip-flop (DFF). In a DDR mode, the circuit can act in the same general fashion as a 2-to-1 parallel-in-serial-out (PISO) circuit.

Figure 1:
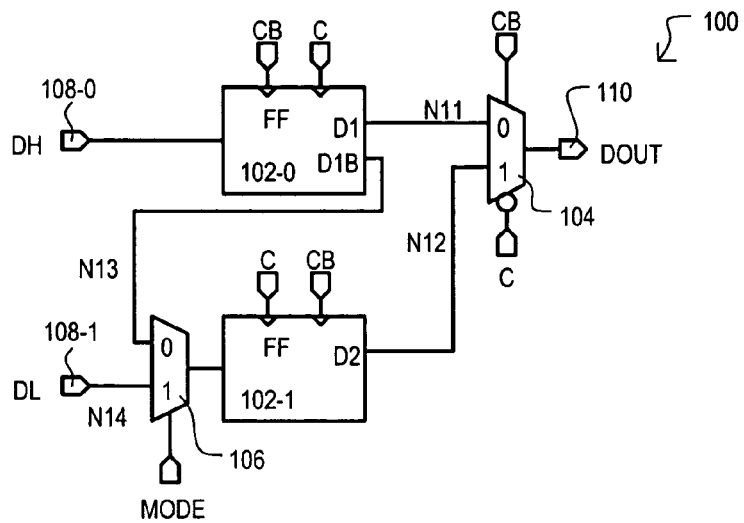
FIG. 1 is a block schematic diagram of a data path circuit according to a first embodiment of the present invention.

A first embodiment of the present invention is set forth in FIG. 1 and designated by the general reference character 100. A data path 100 can include a first clocked latch 102-0, a second clocked latch 102-1, an output multiplexer (MUX) 104, and a mode MUX 106.

In the first embodiment 100, a first clocked latch 102-0 can have a first data input 108-0 that receives first data values DH. An output D1 of first clocked latch 102-0 can be connected to a node N11. Node N11 can serve as one input to output MUX 104. An output D1B of first clocked latch 102-0 can also be provided to node N13, which serves as one input to mode MUX 106. The other input to mode MUX 106, node N14, can be connected to a second data input 108-1 that receives second data values DL.

An output of mode MUX 106 can be connected to an input of second clocked latch 102-1. An output D2 of second clocked latch 102-1 can be connected to a node N12. Node N12 can serve as a second input to output MUX 104. An output of output MUX 104 can be connected to data output node 110, which can provide output data value DOUT.

Clocked latches (102-0 or 102-1) can receive clock signals (CB/C), and in response thereto, function in a transparent mode or a latching mode. In a transparent mode, a data value received at an input can be allowed to flow through the clocked latch to an output. In a latched mode, a data value can be stored and output, but new data values at the input cannot flow through.

In response to MUX control signals (in this example clock signals C and CB), an output MUX 104 can connect either node N11 or N12 to output node 110. In the particular arrangement shown, when an inverse clock signal CB is low, node N11 can be connected to output node 110. When a clock signal C is low, node N12 can be connected to output node 110.

In response to a mode signal MODE, a mode MUX 106 can connect either node N13 or N14 to an input of second clocked latch 102-1. In the particular arrangement shown, when a MODE signal is low, node N13 can be connected to second clocked latch 102-1. When a MODE signal high, node N14 can be connected to second clocked latch 102-1.

A data path circuit 100 is configurable according to mode signal MODE.

When a mode signal MODE is low, data path circuit 100 can operate in the same essential fashion as a DFF. A second data value DL can be prevented from propagating through mode MUX 106, and thus will not be output by the data path circuit 100, while a first data value DH can be allowed to propagate through both first and second clocked latches (102-0 and 102-1).

More particularly, when a clock signal C is low (and inverse clock CB is high), a first input value DH can flow through transparent first clocked latch 102-0 to an input of output MUX 104, and through mode MUX 106 to second clocked latch 102-1.

When clock signal C subsequently transitions high (and inverse clock CB transitions low), a first input value DH can be latched within first clocked latch 102-0 and output through output MUX 104 on output node 110. At the same time, the same first input value DH can flow through second clocked latch 102-1.

When clock signal C subsequently returns low (and inverse clock CB returns high), a first input value DH can be latched within second clocked latch 102-1 on node N12 and output through output MUX 104 as data output value DOUT. At the same time, a new data value received at a first data input 108-0 can flow through first clocked latch 102-0 to an input of mode MUX 106, as described previously.

When a mode signal MODE is high, a data path circuit 100 can operate in a similar fashion as a 2-to-1 PISO circuit.

In the particular example shown, when a clock signal C is low (and inverse clock CB is high), a first input value DH can flow through transparent first clocked latch 102-0 to an input of output MUX 104. However, because a mode signal MODE is high, a first data value will not propagate through mode MUX 106.

When clock signal C subsequently transitions high (and inverse clock CB transitions low), a first input value DH can be latched within first clocked latch 102-0 and output through output MUX 104 on output node 110. At the same time, a second input value DL can flow through second clocked latch 102-1 by way of mode MUX 106.

When clock signal C subsequently returns low (and inverse clock CB returns high), a second input value DL can be latched within second clocked latch 102-1 and output through output MUX 104 as data output value DOUT. At the same time, a new first data value can be received at a first data input 108-0, and can flow through first clocked latch 102-0, as described previously.

In this way, a first embodiment 100 can be selectable one clocking mode (e.g., SDR) and another clocking mode (e.g., DDR).

It is understood that a first embodiment can be conceptualized as a modified master-slave type flip-flop (MS-FF). In particular, a first clocked latch 102-0 can be considered a master latch, and second clocked latch 102-1 can be a slave latch. However, unlike a conventional MS-FF, an output MUX 104 and mode MUX 106 can be included. Output MUX 104 can have one input coupled to an output of a master latch 102-0 and another input coupled to an output of a slave latch 102-1. Mode MUX 106 can be interposed between a master latch 102-0 and slave latch 102-1, with one input coupled to an output of a master latch 102-0 and another input coupled to a second data input 108-1. An output of mode MUX 106 can be connected to an input of slave latch 102-1.

The above highlights how a data path can be selectable between multiple clocking modes, with relatively little increase in circuit size over a DFF. That is, a conventional 2-to-1 PISO approach could utilize at least two DFFs (four clocked latches) a multiplexer (and likely more components to implement the additional multiplexing needed for SDR mode). In contrast, the above embodiment includes only two clocked latches and two multiplexers.

Further, the above embodiment can be easily selectable between modes by a single signal MODE. Such arrangement allow a single circuit to be configured for different clocking arrangement via simple manufacturing options, or even dynamically.

Figure 2A:
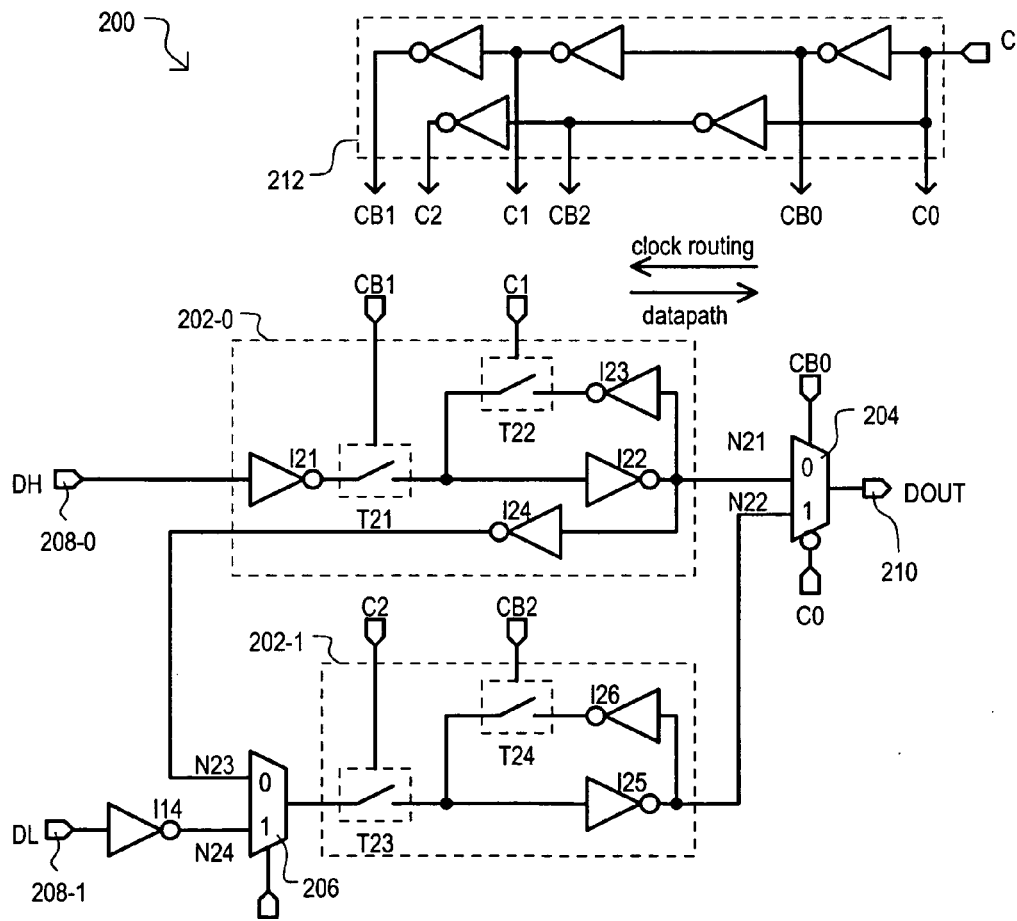
FIG. 2A is a schematic diagram of a data path circuit according to a second embodiment of the present invention.
Figure 2B:
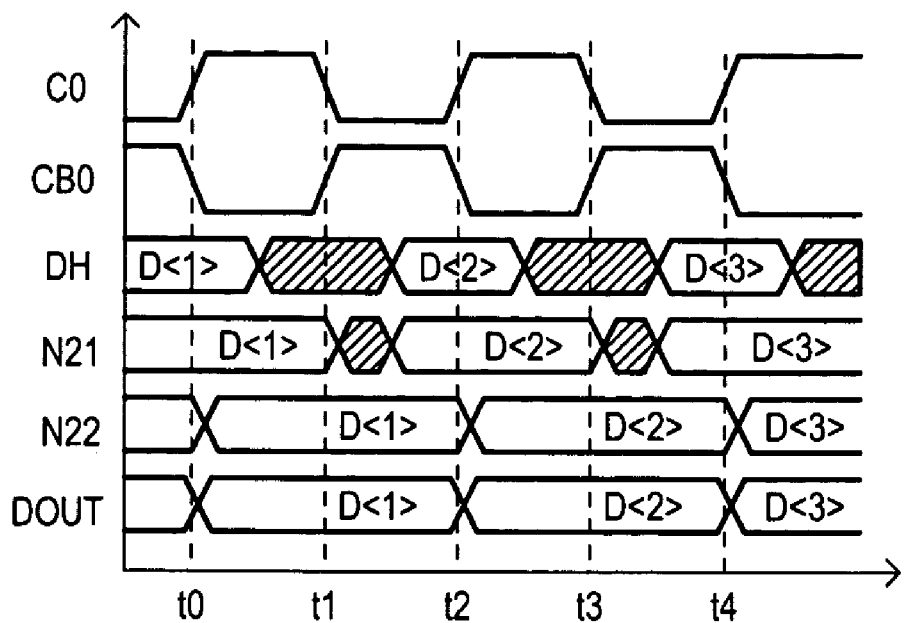
FIG. 2B is a timing diagram showing the operation of the circuit in FIG. 2A in a single data rate (SDR) mode.
Figure 2C:
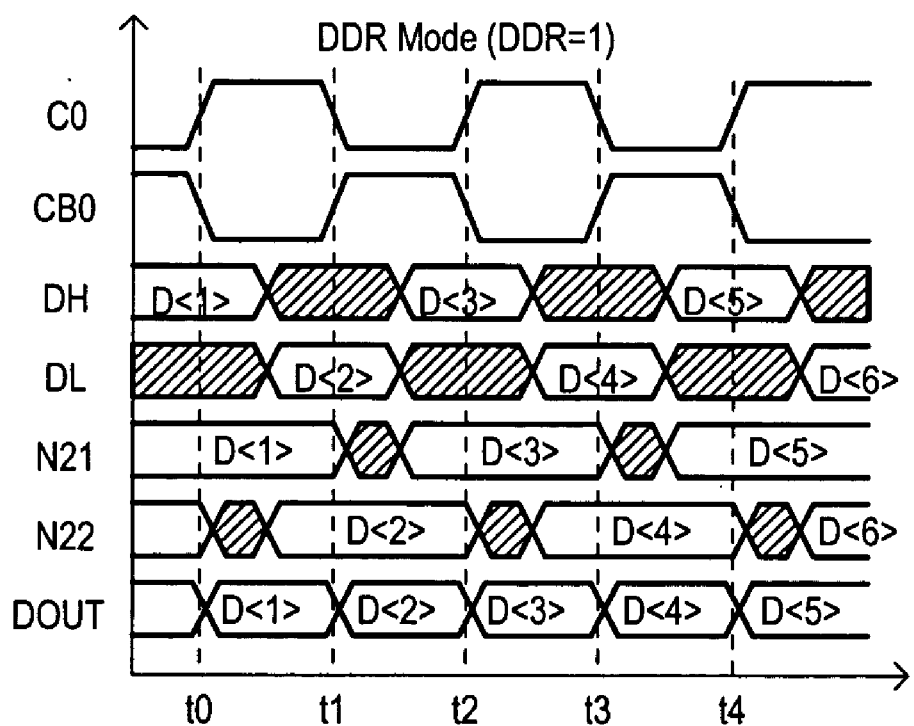
FIG. 2C is a timing diagram showing the operation of the circuit in FIG. 2A in a double data rate (DDR) mode.

A second embodiment of the present invention will now be described with reference to FIGS. 2A to 2C. FIG. 2A is a detailed schematic diagram showing a data path circuit according to a second embodiment. FIG. 2B is a timing diagram showing the operation of the circuit of FIG. 2A in a first (SDR) mode. FIG. 2C is a timing diagram showing the operation of the circuit of FIG. 2A in a second (DDR) mode.

Referring now to FIG. 2A, a data path 200 according to a second embodiment can have the same general components as a first embodiment. Accordingly, like portions will be referred to by the same reference character but with the first digit being a "2" instead of "1".

In the second embodiment 200, a first clocked latch 202-0 can receive a first input value DH at a first data input 208-0, and provide a latched data value to a node N21. In the particular example of FIG. 2A, a first clocked latch 202-0 can include inverters I22 and I23 and transmission gates T21 and T22. Transmission gate T21 allows a data value to flow through the clocked latch according to inverted clock signal CB1. Inverters I22 and I23 can latch data according to transmission gate T22, which is enabled according to clock signal C1.

Similarly, second clocked latch 202-1 can include inverters I25 and I26 and transmission gates T23 and T24, with transmission gate T23 allowing a data value to flow through the clocked latch according to clock signal C2. Further, transmission gate T24 can enable a latch formed by inverters I25 and I26, according to inverted clock signal CB2.

In the second embodiment 200, a first clocked latch 202-0 may also include an input inverter I21 and output inverter I24. Such inverters can ensure that a resulting first data value DH has an appropriate logic level when output at nodes N21 and N23. Similarly, the second embodiment 200 also includes inverter I14 for providing appropriate logic level to second data value DL received at second data input 208-1.

As in the case of the first embodiment, a data path circuit mode can be controlled according to single signal (in this case the signal DDR). An SDR mode can be enabled when signal DDR is low. In such an arrangement, a second input value DL can be ignored.

Referring now to FIG. 2A in conjunction with FIG. 2B, an SDR mode of operation will be described. In the below description, it will be assumed that clock signals C1 and C2 generally follow clock signal C0, with a predetermined propagation delay. Further, inverse clock signals CB1 and CB2 generally follow inverse clock signal CB0 with a predetermined propagation delay.

Prior to time t0, a data value D<1> can be present at first data input 208-0. Because inverse clock signal CB1 is high, a first clocked latch 202-0 can be transparent, allowing data value D<1> to flow through to both nodes N21 and N23.

At time t0, clock signal C0 can transition high, while inverse clock signal CB0 transitions low. As a result, first clocked latch 202-0 can latch data value D<1> at node N21. Further, output MUX 204 can output the value at node N21 as output value DOUT. At the same time, a second clocked latch 202-1 can be transparent, allowing data value D<1> to flow through to node N22.

At time t1, clock signal C0 can return low, while inverse clock signal CB0 can return high. As a result, second clocked latch 202-1 can latch data value D<1> at node N22. Further, by operation of output MUX 204, this data value can be provided as output value DOUT. At the same time, a first clocked latch 202-0 can be transparent, allowing a new data value D<2> to flow through to node N22.

The operations can continue for each new data value received at first data input 208-0.

As shown by FIG. 2B, data values can be provided each clock cycle, with output MUX 204 providing a data value from node N21 on one half clock cycle (C0 high), and the same data value from the other node N22 on the other half clock cycle (C0 low).

A DDR mode can be enabled when signal DDR is high. In such an arrangement, a first input value DH is prevented from propagating through mode MUX 206.

Referring now to FIG. 2A in conjunction with FIG. 2C, a DDR mode of operation will be described. In a similar fashion to an SDR mode, prior to time t0, a data value D<1> can be present at first data input 208-0. Because inverse clock signal CB1 is high, a first clocked latch 202-0 can be transparent, allowing data value D<1> to flow through to both nodes N21 and N23.

At time t0, clock signal C0 can transition high, while inverse clock signal CB0 transitions low. As a result, first clocked latch 202-0 can latch data value D<1> at node N21.

Further, output MUX 204 can output the value at node N21 as output value DOUT. At the same time, a second clocked latch 202-1 can be transparent. However, due to operation of mode MUX 206, data value D<2> at second data input 208-1 can to flow through to node N22.

At time t1, clock signal C0 can return low, while inverse clock signal CB0 can return high. As a result, second clocked latch 202-1 can latch data value D<2> at node N22. Further, by operation of output MUX 204, this data value can be provided as output value DOUT. At the same time, a first clocked latch 202-0 can be transparent once again, allowing a new data value D<3> to flow through to node N22.

These operations can continue for each new data value received at data inputs 208-0 and 208-1.

As shown by FIG. 2C, data values received in parallel at data input nodes (208-0 and 208-1) can be output in a serial fashion each half clock cycle.

In this way, a data output path 200 can operate in either an SDR mode or DDR mode according to a single mode signal DDR.

Figure 9A:
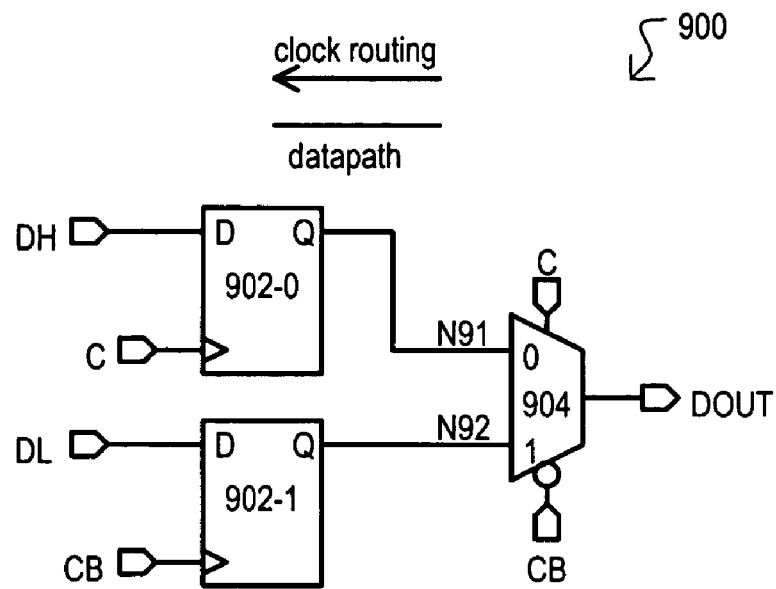
FIG. 9A is schematic diagram of a conventional 2-to-1 parallel-in-serial-out (PISO) circuit for accommodating a DDR mode of operation.
Figure 9B:
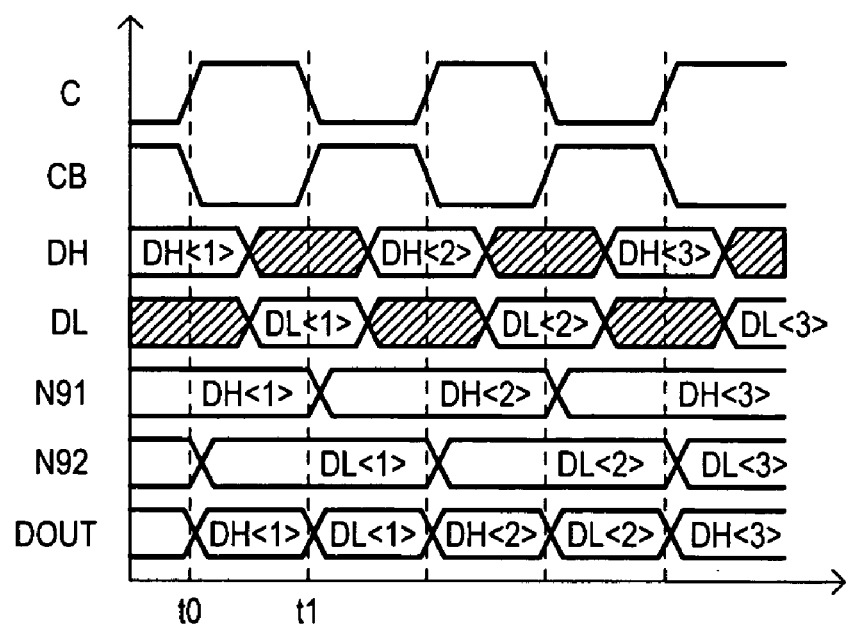
FIG. 9B is a timing diagram showing the operation of the circuit of FIG. 9A.

Like the conventional DFF shown in FIG. 9A, in the embodiment of FIG. 2A, it is preferable have clock signals routed in the reverse direction with respect to a flow of data through the circuit. This can ensure that output MUX 204 outputs a value at node N21 before node N22 can be updated by an incoming data value, and vice versa.

One very particular example of a clock routing circuit is shown in FIG. 2A and designated by the general reference character 212. Of course, the clock routing circuit 212 is but one example, and should not be construed a limiting the invention thereto. Further, in such a clock routing circuit, inverters can introduce de-skewing into respective complementary clock signal pairs C0/CB0, C1/CB1 and C2/CB2.

Of course, the various sections of the circuits shown above can be subject to considerable variation when implemented by those skilled in the art. As but one example, a mode multiplexer (e.g., 106 and 206) and/or output multiplexer (e.g., 104 and 204) could take a variety of forms. To illustrate this point, three of the many possible MUX circuits are shown in FIGS. 3A to 3C.

Figure 3A:
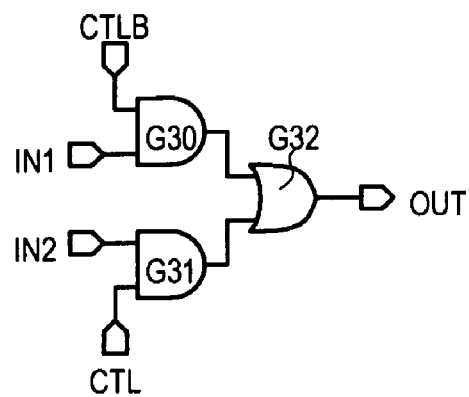
FIGS. 3A to 3C are schematic diagrams of multiplexer (MUX) circuits that can be utilized in the embodiments of the present invention.

FIG. 3A illustrates how a MUX circuit can include logic gates G30 and G31 that receive input data values at nodes IN1 and IN2 and MUX control values CTLB and CTL. Outputs from logic gates G30 and G31 can be combined in a logic gate G32. Of course, an equivalent logical function can be achieved with a different set of logic gates.

Figure 3B:
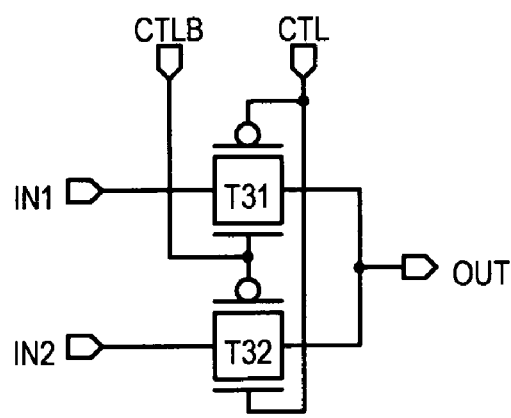

FIG. 3B shows an arrangement in which MUXing can be accomplished with transmission gates T31 and T32, which are enabled according to MUX control values CTL and CTLB.

Figure 3C:
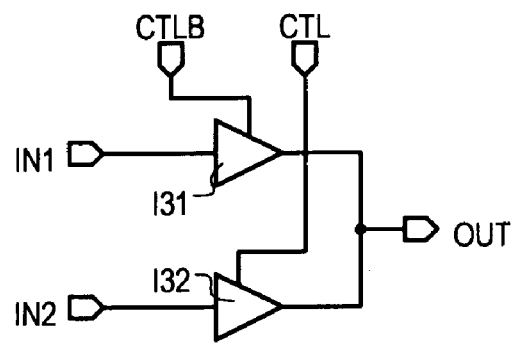

FIG. 3C shows an arrangement in which MUXing can be accomplished with tristatable drivers I31 and I32. Tristatable drivers (I31 and I32) can drive an output node OUT when enabled and provide a high impedance when disabled.

Of course, one skilled in the art could arrive at other equivalent variations in MUX structure.

Figure 4:
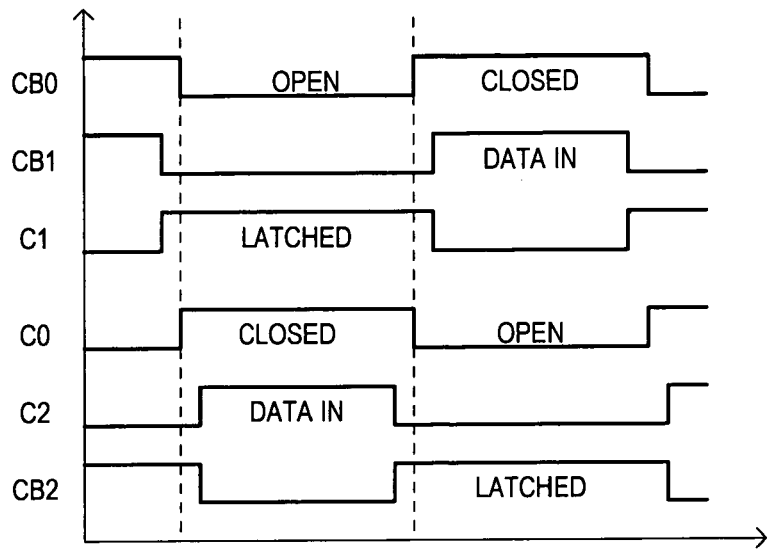
FIG. 4 is a timing diagram showing a non-overlapping clocking arrangement according to an embodiment.

Still further, while the above embodiments have described arrangements in which clock signals can overlap, other embodiments may include non-overlapping clocking arrangements. One such example is shown in FIG. 4 is a timing diagram showing the clock signals of FIG. 2A in a non-overlapping configuration.

As understood from the figure, clocks signals C1/CB1 can be non-overlapping with respect to clock signal CB0. Similarly, clocks signals C2/CB2 can be non-overlapping with respect to clock signal C0.

Such an arrangement can help to ensure that a received input data value (DL or DH) does not erroneously propagate to an input of the output MUX, before the output MUX switches.

Referring now to FIG. 5A, a memory device according third embodiment is set forth in a block schematic diagram and designated by the general reference character 500. A memory device 500 can be a random access memory (RAM), preferably a dual port static RAM. A memory device 500 can include a memory cell array 502 that can include dual port memory cells accessible by a first address decoder 504-0 and a second address decoder 504-1. Data values may be written into memory cell array 502 by way of an input circuit 506.

Figure 5:
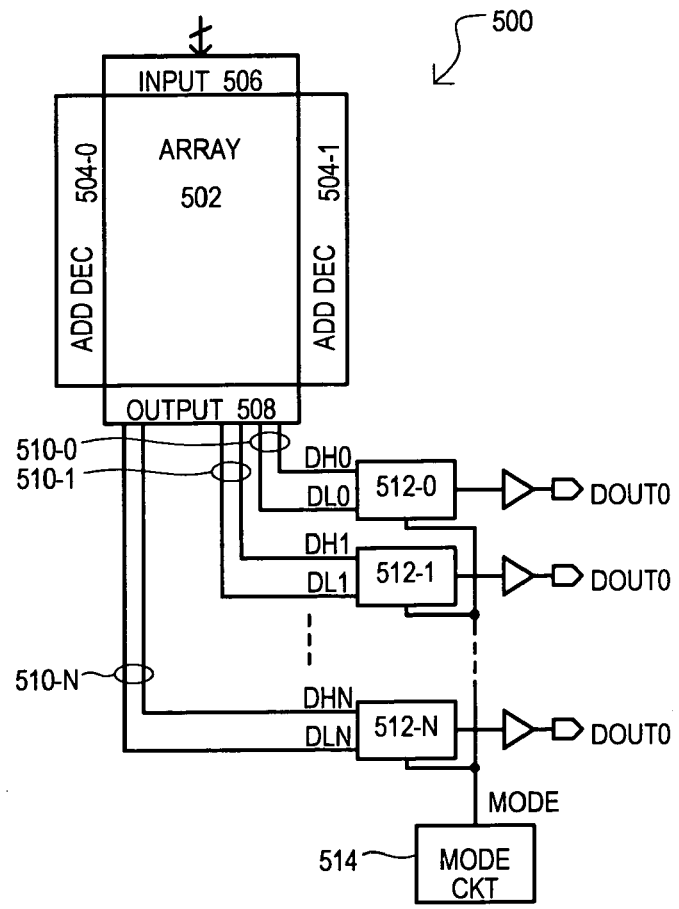
FIG. 5 is a block schematic diagram of a memory device according to another embodiment of the present invention.

Referring still to FIG. 5, data values can be output from a memory cell array 502 by way of an output circuit 508. An output circuit can provide data values (DH0/DL0 to DHN/DLN) by way of output line pairs 510-0 to 510-N. Each output line pair (510-0 to 510-N) can be provided to a corresponding data path circuit 512-0 to 512-N. A data path circuit (512-0 to 512-N) may have any of the configurations described in the above embodiments, or equivalents. Clock signals to such circuits have been omitted in FIG. 5 to avoid cluttering the view.

As shown in FIG. 5, a mode circuit 514 can generate a mode signal MODE (i.e., DDR in FIG. 2A). Mode signal MODE can be commonly provided to each data path circuit (512-0 to 512-N) to thereby establish a mode of operation (e.g., SDR or DDR).

In this way, the present invention can include a memory device having output data paths that are easily configurable between different clocking modes.

One skilled in the art would recognize that a mode circuit 514 could take various forms. A number of particular examples will now be described. However, such examples should not necessarily be construed as limiting the invention thereto.

Figure 6:
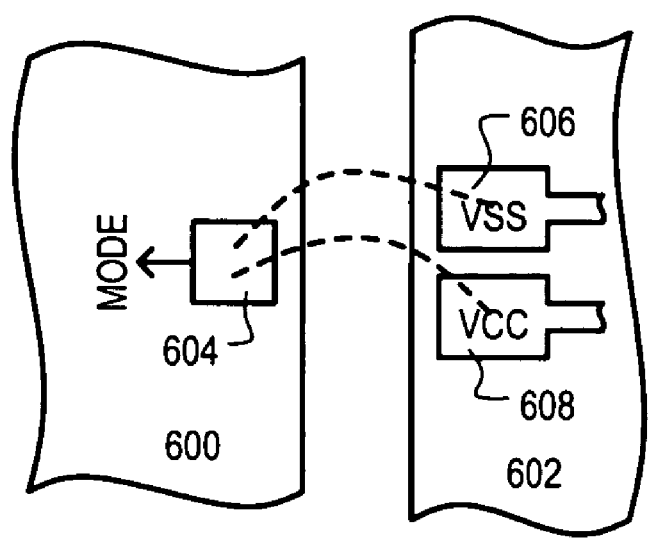
FIG. 6 is a top plan view showing a mode setting bonding option that can be used in embodiments of the present invention.

A first example of a mode circuit is shown in FIG. 6. FIG. 6 is a top plan view of a portion of an integrated circuit 600 and a corresponding portion of a package 602 containing the integrated circuit 600. As illustrated by FIG. 6, a mode value can be established with a bonding option. If a mode signal MODE is to have one value (e.g., low or SDR), a bond pad 604 can be bonded to a low power supply VSS lead line 606. Conversely, if a mode signal MODE is to have another value (e.g., high or DDR), a bond pad 604 can be bonded to a high power supply VCC lead line 608. Of course other bonding options are possible according to package (e.g., flip-chip, etc.). Thus, FIG. 6 should not be construed as limiting the invention to any particular package/bonding technology.

Of course, such an arrangement could be established via a metal option. In such a case, in an SDR device, one mask layer can be used that forms a metallization layer which routes a mode signal line to one supply level (e.g., VSS). In a DDR device, a different mask can be used which forms metallization layer that can route a mode signal line to another supply level (e.g., VCC).

However, a bonding option remains a preferably simpler approach.

Still further, according to any of many well know conventional techniques, a mode signal MODE can be programmed to be either high or low using programmable circuit elements.

Figure 7:
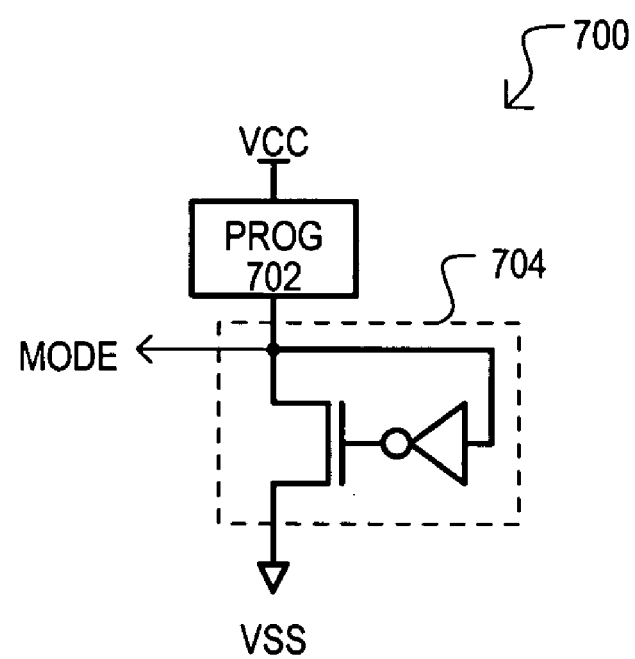
FIG. 7 is a schematic diagram that illustrates a mode setting circuit that can be used in embodiments of the present invention.
Figure 8A:
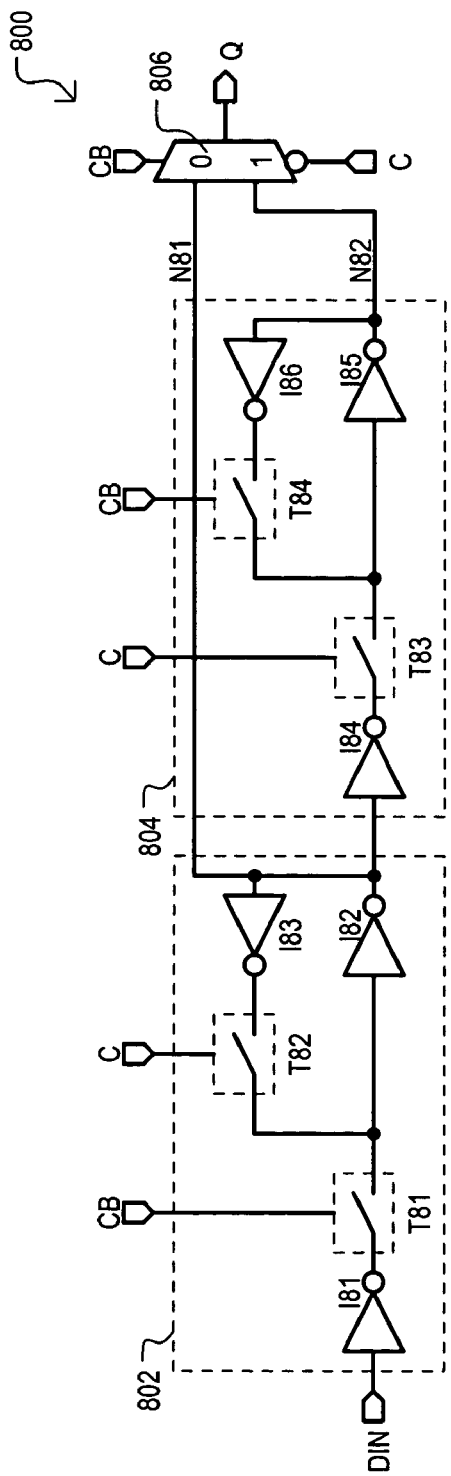
FIG. 8A is schematic diagram of a conventional D-type master-slave flip-flop circuit for accommodating an SDR mode of operation.
Figure 8B:
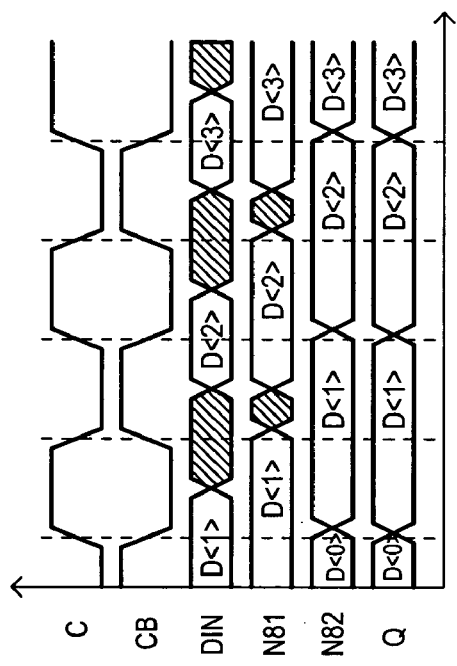
FIG. 8B is a timing diagram showing the operation of the circuit of FIG. 8A.

FIG. 7 is a block diagram showing one very particular example of how a mode circuit 700 can be implemented utilizing programmable options. FIG. 7 shows a mode circuit 700 that includes a programmable element 702 and a state circuit 704. A programmable element 702 can be programmed to provide a high or low impedance. A state circuit 704 can generate a mode signal according to the status of the programmable element 702. A programmable circuit element can include, but not limited to: a fusible link, a nonvolatile memory cell or an anti-fuse structure.

Of course, the numerous clocks described above may be generated by various approaches, and include additional components, such as buffers, conditioners, intervening logic circuits conditioned on other signals, or interlock circuits as needed in a particular application, to name but a few examples. The above examples represent generalized examples of generated clock signals.

The various embodiments of the present invention can be seen as an improved DFF that can support both SDR and DDR operations. Further, as noted above, such effects can be achieved by using the same components as a conventional DFF plus a MUX and an inverter. Thus, the circuits may be advantageously compact, particularly when compared to a convention 2-to-1 PISO circuits.

The various embodiments can be easily implemented as a standard cell in the same fashion as a conventional DFF.

When used in a data communication memory or other memory product that requires both SDR and DDR modes of operations, the embodiments can be used as output registers to replace conventional DFFs, so that no additional multiplexing is need in order to support the DDR mode.

It is understood that the embodiments of the invention may be practiced in the absence of an element and or step not specifically disclosed. That is, an inventive feature of the invention can be elimination of an element or step.

Accordingly, while the various aspects of the particular embodiments set forth herein have been described in detail, the present invention could be subject to various changes, substitutions, and alterations without departing from the spirit and scope of the invention.

What is claimed is:

1. A configurable data path, comprising:
   a first clocked latch having an input that receives a first data value and an output coupled to one input of an output multiplexer (MUX) circuit;
   a mode MUX circuit having one input that receives a second input value and another input coupled to the output of the first clocked latch; and
   a second clocked latch having an input coupled to an output of the mode MUX circuit, and an output coupled to another input of the output MUX circuit; wherein
   the output MUX circuit selects between the one input and the other input on essentially different half clock cycles of the same clock signal.

2. The configurable data path of claim 1, wherein:
   the mode MUX circuit selects between the one input and the other input based on a single mode signal.

3. The configurable data path of claim 1, wherein:
   the mode MUX circuit comprises
      one input logic gate for each input signal that receives the input signal at an input, and
      an output logic gate having inputs coupled to the outputs of each input logic gate.

4. The configurable data path of claim 1, wherein:
   the mode MUX circuit comprises
      a first tri-state driver circuit having an input coupled to one input of the mode MUX circuit, an output coupled to a MUX output node, and a control input coupled to a first clock signal, and
      a second tri-state driver circuit having an input coupled to another input of the mode MUX circuit, an output coupled to the MUX output node, and a control input coupled to a second clock signal.

5. The configurable data path of claim 1, wherein:
   the mode MUX circuit comprises
      a first passgate having an input coupled to one input of the mode MUX circuit, an output coupled to an output node, and a control input coupled to a mode signal, and
      a second passgate having an input coupled to another input of the mode MUX circuit, an output coupled to the output node, and a control input coupled to an inverted mode signal.

6. The configurable data path of claim 1, wherein:
   the first clocked latch comprises,
      a first input passgate enabled in response to a complementary latch clock signal,
      a first inverter having an input coupled to the output of the first input pass-gate,
      a second inverter having an input coupled to the output of the first inverter, and
      a first latching passgate enabled in response to a latch clock signal and an output coupled to the input of the first inverter.

7. The configurable data path of claim 6, wherein:
   the output MUX circuit selects for output one of the inputs on essentially different half clock cycles of the at least one MUX control signals; wherein
   the at least one MUX control signal does not overlap the latch clock signals.

8. The configurable data path of claim 1, further including:
   the output MUX circuit is controlled in response to a clock signal;
   the first clocked latch is controlled in response to the clock signal;
   the second clocked latch is controlled in response to the clock signal; and
   a clock routing circuit that provides control signals for the output MUX circuit, second clocked latch and first clocked latch, in an order opposite to data flow through said circuit and latches.

9. A data path circuit configurable between at least a single data rate (SDR) and double data rate (DDR) mode, comprising:
   a slave latch and master latch;
   a mode multiplexer (MUX) circuit disposed between the master latch and the slave latch, having one input coupled to the output of the master latch, another input that receives a first data value, and an output coupled to the input of the slave latch;
   an output MUX circuit having one input coupled to the output of the master latch, another input coupled to the output of the slave latch, the output MUX circuit being controlled in response to a clock signal; and
   the master and slave latches being controlled in response to the clock signal.

10. The data path circuit of claim 9, wherein:
   the mode MUX circuit couples the respective one input to a mode MUX output when a mode value has an SDR value, and couples the respective other input to the mode MUX output when the mode value has a DDR value.

11. The data path circuit of claim 9, wherein:
   the output MUX circuit couples the output of the slave latch to an output node when a clock signal is low, and couples the output of the master latch to the output node when a complementary clock signal is low.

12. The data path circuit of claim 9, wherein:
the master and slave latch each comprise
  a first input pass-gate,
  a first inverter having an input coupled to the output of the first input pass-gate,
  a second inverter having an input coupled to the output of the first inverter, and
  a first latching passgate having an output coupled to the input of the first inverter.

13. The data path circuit of claim 9, further including:
a clock routing circuit that provides the clock signal to the output MUX type circuit and master and slave latches in an order opposite to a data flow through said circuit and latches.

14. A semiconductor memory device, comprising:
an output circuit configurable between at least two clocking modes comprising,
  a first register section having an input coupled to a first data output of a memory cell array, the first register section being transparent in response to an inverse clock signal and latching in response to a clock signal,
  a mode multiplexer (MUX) having a first input coupled to a second data output of a memory cell array, a second input coupled to the output of the first register section, and a control input that receives a mode signal, and
  a second register section having an input coupled to an output of the mode MUX, the second register section being transparent in response to the clock signal and latching in response to the inverse clock signal.

15. The semiconductor memory device of claim 14, further including:
  an output MUX having a first MUX input coupled to an output of the first register section and a second MUX input coupled to an output of the second register section, and a MUX output coupled to an external data output of the semiconductor memory device.

16. The semiconductor memory device of claim 14, further including:
  a dual port static random access memory (SRAM) array coupled to the first data output and the second data output.

17. The semiconductor memory device of claim 14, further including:
  the semiconductor memory device comprises N external data outputs; and
  one output circuit corresponding to each external data output.

18. The semiconductor memory device of claim 14, further including:
  a mode signal generator circuit that generates the mode signal in response to a bonding option.

19. The semiconductor memory device of claim 14, further including: a mode signal generator circuit that generates the mode signal in response to a programmable circuit structure selected from the group consisting of: a metallization option, a nonvolatile memory cell, a fusible link, and an anti-fuse structure.

* * * * *